US010050585B2

(12) United States Patent
Kumar et al.

(10) Patent No.: US 10,050,585 B2
(45) Date of Patent: Aug. 14, 2018

(54) ULTRA-LOW POWER CRYSTAL OSCILLATOR WITH ADAPTIVE SELF-START

(71) Applicant: Microchip Technology Incorporated, Chandler, AZ (US)

(72) Inventors: Ajay Kumar, Phoenix, AZ (US); Giang Le, Tempe, AZ (US)

(73) Assignee: MICROCHIP TECHNOLOGY INCORPORATED, Chandler, AZ (US)

( * ) Notice: Subject to any disclaimer, the term of this patent is extended or adjusted under 35 U.S.C. 154(b) by 56 days.

(21) Appl. No.: 15/184,683

(22) Filed: Jun. 16, 2016

(65) Prior Publication Data

US 2016/0373055 A1 Dec. 22, 2016

Related U.S. Application Data

(60) Provisional application No. 62/181,554, filed on Jun. 18, 2015.

(51) Int. Cl.
| | |
|---|---|
| *H03B 5/32* | (2006.01) |
| *H03B 5/06* | (2006.01) |
| *H03L 3/00* | (2006.01) |
| *H03B 5/36* | (2006.01) |
| *H03L 7/099* | (2006.01) |
| *H03L 5/00* | (2006.01) |
| *H03K 21/40* | (2006.01) |

(52) U.S. Cl.
CPC ............... *H03B 5/06* (2013.01); *H03B 5/32* (2013.01); *H03B 5/36* (2013.01); *H03B 5/364* (2013.01); *H03K 21/406* (2013.01); *H03L 3/00* (2013.01); *H03L 5/00* (2013.01); *H03L 7/099* (2013.01); *H03B 2200/0074* (2013.01); *H03B 2200/0082* (2013.01); *H03B 2200/0094* (2013.01)

(58) Field of Classification Search
CPC .. H03L 3/00; H03L 7/099; H03L 5/00; H03B 5/36; H03B 2200/0074; H03B 2200/0082; H03B 2200/0094; H03B 5/32; H03K 21/406
USPC ............................ 331/185, 183, 158, 116 FE
See application file for complete search history.

(56) References Cited

U.S. PATENT DOCUMENTS

| 4,956,618 | A  * | 9/1990 | Ulmer ................. H03B 5/364 |
|---|---|---|---|
| | | | 331/108 A |
| 8,902,011 | B2 * | 12/2014 | Su ....................... H03B 28/00 |
| | | | 331/158 |

(Continued)

FOREIGN PATENT DOCUMENTS

EP 0905877 A1 3/1999 .............. G04F 5/06

OTHER PUBLICATIONS

International Search Report and Written Opinion, Application No. PCT/US2016/038048, 12 pages, dated Oct. 11, 2016.

*Primary Examiner* — Arnold Kinkead
(74) *Attorney, Agent, or Firm* — Slayden Grubert Beard PLLC

(57) ABSTRACT

A crystal oscillator is started in a high power mode for a certain period of time to ensure starting oscillation with average grade crystals, then once the certain time period is over the oscillator switches into a low power mode and sustains oscillation with energy pulses triggered by and synchronized with the oscillator output frequency. These energy pulses may be generated on the positive, negative or both positive and negative edges of the clock output waveform.

18 Claims, 3 Drawing Sheets

(56) References Cited

U.S. PATENT DOCUMENTS

2002/0180542 A1 12/2002 Aihara et al. ............... 331/158
2012/0306585 A1 12/2012 Mack ........................... 331/182

* cited by examiner

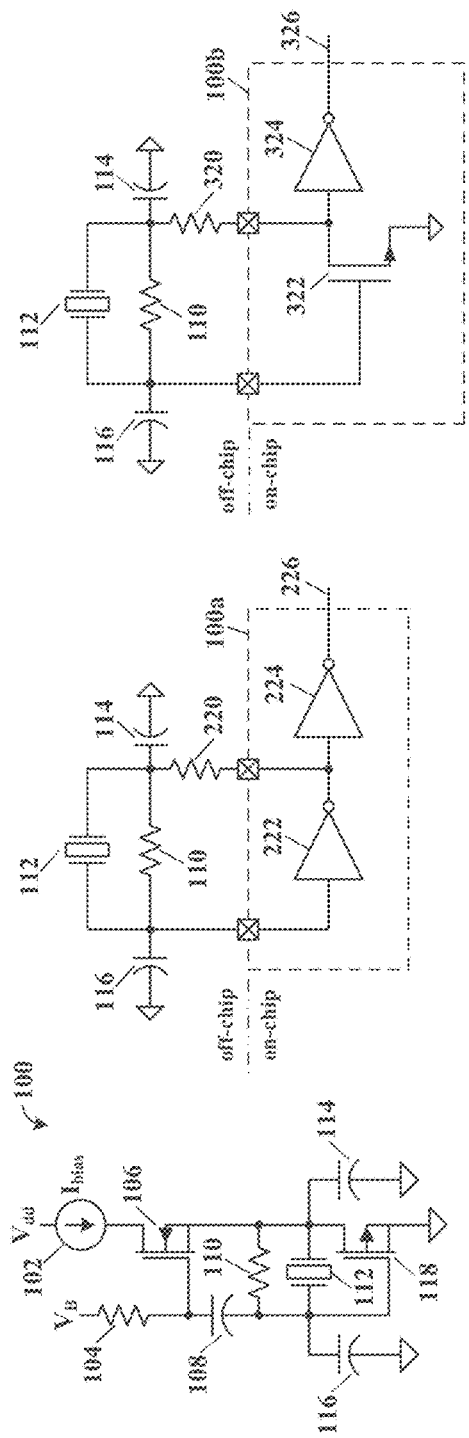
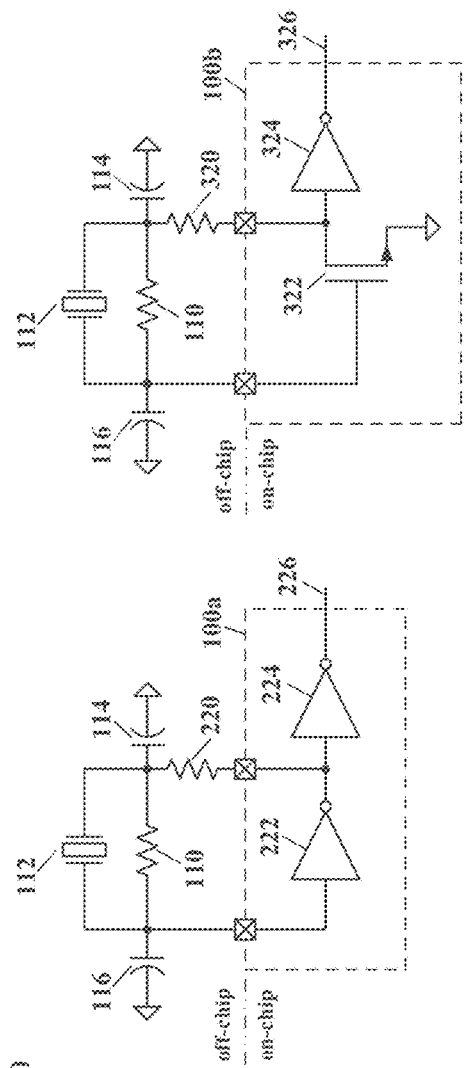
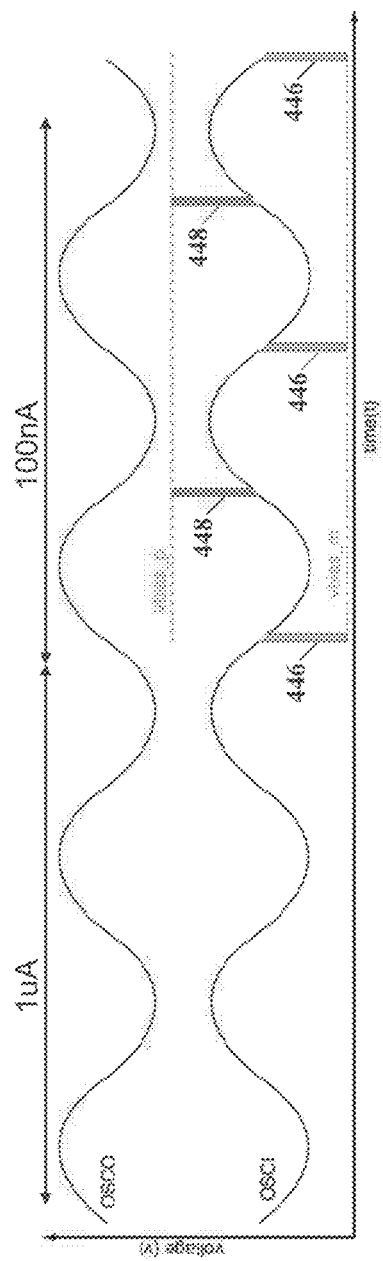

ULTRA-LOW POWER CRYSTAL OSCILLATOR WITH ADAPTIVE SELF-START

RELATED PATENT APPLICATION

This application claims priority to commonly owned U.S. Provisional Patent Application No. 62/181,554; filed Jun. 18, 2015; which is hereby incorporated by reference herein for all purposes.

TECHNICAL FIELD

The present disclosure relates to crystal oscillators and, in particular, to an ultra-low power crystal oscillator with adaptive self-start.

BACKGROUND

To ensure low power consumption in a sleep mode, a microcontroller may be switched to a very low frequency system clock provided by an internal or external oscillator. A conventional 32 KHz oscillator consumes about one microampere and the power budget for an entire system in an industry standard deep sleep mode is one (1) microampere. In order to meet this industry standard deep sleep requirement, the oscillator has to consume less than 150 nanoamperes, including bias generation, and still be able to support a wide range of crystals. With such a wide variation of crystal quality ($R_{ESR}$ from about 30 kilohms to about 90 kilohms) based upon temperature, a crystal oscillator will not start or cannot sustain oscillation at such low current values. Lower power crystal oscillators, approximately 200 nanoamperes, will only work with very low ESR crystals that are expensive and not readily available.

SUMMARY

Therefore a need exists for a crystal oscillator that will start and work with a wide range of crystals, work mostly at very low power consumption and sustain oscillation at the very low power consumption.

According to an embodiment, an integrated oscillator configured to be coupled with an external crystal, may comprise: an oscillator configured for a crystal to control an oscillation frequency thereof; a control circuit configured to operate in a first and a second mode, wherein at start-up of the oscillator the control circuit operates in the first mode and configures the oscillator to operate at a first power consumption, wherein the control circuit switches to the second mode after a certain time period of the oscillator oscillating; wherein when in the second mode the control circuit configures the oscillator to operate at a second power consumption which may be less than the first power consumption; and oscillation may be sustained during operation at the second power consumption by injecting pulses into the oscillator at rising and/or falling edges of an output signal from the oscillator.

According to a further embodiment, a counter may determine the certain time period by counting a number of cycles of the output signal from the oscillator. According to a further embodiment, a pulse generator may be enabled by the counter and generate at least one pulse every cycle of the output signal. According to a further embodiment, the pulse generator may generate the pulses having pulse widths from about five (5) nanoseconds to about 500 nanoseconds. According to a further embodiment, the pulse generator may generate the pulses having pulse widths of about 100 nanoseconds. According to a further embodiment, the pulse generator may generate the pulses having pulse widths of about 5 nanoseconds. According to a further embodiment, the second power consumption may be less than the first power consumption. According to a further embodiment, the second power consumption may be about ten percent of the first power consumption.

According to a further embodiment, a microcontroller may comprise the integrated oscillator.

According to a further embodiment, the oscillator may comprise an inverter. According to a further embodiment, the oscillator may comprise a trans-conductor.

According to a further embodiment, the oscillator may comprise: a current source coupled to a supply voltage; a first resistor coupled to a bias voltage; a first capacitor coupled to the first resistor; a second resistor coupled to the first capacitor; a first transistor coupled to the current source, first capacitor, and first and second resistors; a second capacitor coupled to the first capacitor and second resistor; a third capacitor coupled to the second resistor and first transistor; a second transistor coupled to the first, second and third capacitors, the second resistor and the first transistor; and the external crystal coupled to the first and second transistors; the first, second and third capacitors; and the second resistor.

According to a further embodiment, the first power consumption may comprise a current of from about 500 nanoamperes to about one (1) microampere. According to a further embodiment, the second power consumption may comprise a current of from about 25 nanoamperes to about 100 nanoamperes. According to a further embodiment, the pulses may be delayed by about one-half cycle from the rising and/or falling edges of the output signal from the oscillator.

According to another embodiment, a method for starting and running an integrated oscillator configured to be coupled with an external crystal may comprise the steps of: controlling a frequency of an oscillator with a crystal; starting operation of the oscillator in a first mode wherein the oscillator operates at a first power consumption; operating the oscillator in a second mode after a certain time period of the oscillator oscillating, wherein the oscillator operates at a second power consumption and the second power consumption may be less than the first power consumption; and injecting pulses into the oscillator at rising and/or falling edges of an output signal from the oscillator to sustained operation of the oscillator at the second power consumption.

According to a further embodiment of the method may comprise the step of delaying the pulses by about one-half cycle from the rising and/or falling edges of the output signal from the oscillator.

BRIEF DESCRIPTION OF THE DRAWINGS

A more complete understanding of the present disclosure may be acquired by referring to the following description taken in conjunction with the accompanying drawings wherein:

FIG. 1 illustrates a schematic diagram of a crystal oscillator circuit;

FIG. 2 illustrates a schematic diagram of an inverter implementation of the oscillator shown in FIG. 1;

FIG. 3 illustrates a schematic diagram of a trans-conductor implementation of the oscillator shown in FIG. 1;

FIG. 5 illustrates schematic graphs of oscillator input and output waveforms, according to the teachings of this disclosure.

Figure 4:
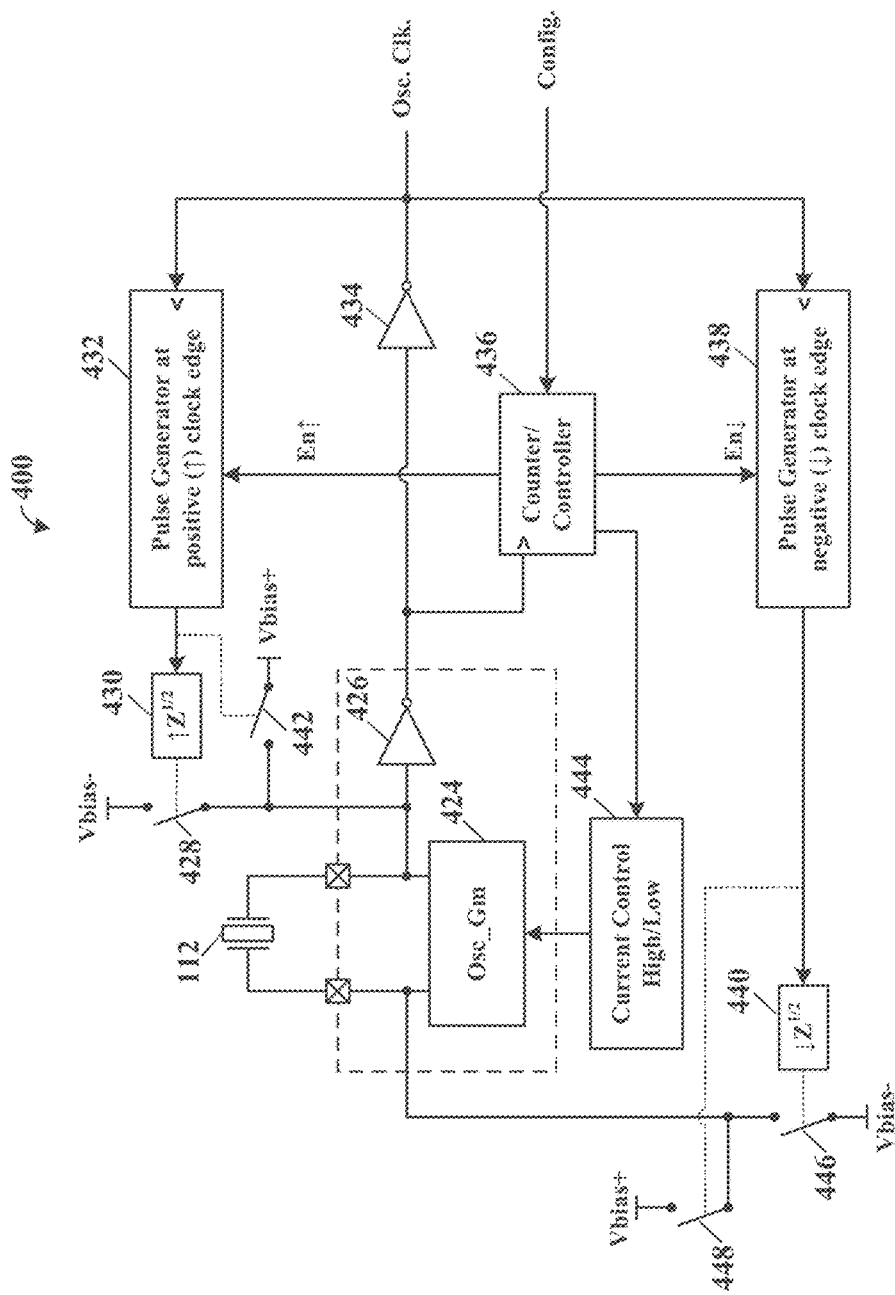
FIG. 4 illustrates a schematic block diagram of an ultra-low power crystal oscillator with adaptive self-start, according to a specific example embodiment of this disclosure.

While the present disclosure is susceptible to various modifications and alternative forms, specific example embodiments thereof have been shown in the drawings and are herein described in detail. It should be understood, however, that the description herein of specific example embodiments is not intended to limit the disclosure to the particular forms disclosed herein.

Detailed Description

According to various embodiments of this disclosure, an adaptive self-start crystal oscillator may be provided to ensure oscillation while using ultra-low power, e.g., 100 nanoamperes. Running at 100 nanoamperes, an oscillator does not tend to start with a wide range of crystals. There may be a few crystals (very low $R_{ESR}$) that will work in such a low power oscillator but very few are available and are very expensive. In order to circumvent the aforementioned problem, an improved oscillator circuits may start at about one (1) microampere and once oscillation is obtained the operating current may be reduced for example but is not limited to about 100 nanoamperes. However, an oscillator cannot sustain its oscillation at 100 nanoamperes using readily available crystals. A conventional approach for providing low power crystal oscillators requires using special high quality and expensive crystals, because if the oscillation does not start before the timer expires, the oscillator will never start.

According to various embodiments of this disclosure, oscillation in a low power crystal oscillator may be sustained by injecting additional energy into the oscillator circuit by providing pulses controlled by its own clock output. This crystal oscillator may start-up at a higher current before switching to low current operation. Then after a certain number of output cycles, switches over to lower power operation with energy pulses, synchronized with the oscillator output, being injected into the oscillator circuit. By using a timer, e.g., 1024 counter, running from the crystal oscillator output, the power saving circuit will wait for the crystal oscillator to sufficiently sustain its oscillation before it switches the oscillator to a low current mode, e.g., about 100 nanoamperes.

Referring now to the drawings, the details of example embodiments are schematically illustrated. Like elements in the drawings will be represented by like numbers, and similar elements will be represented by like numbers with a different lower case letter suffix.

Referring to FIG. 1, depicted is a schematic diagram of a crystal oscillator circuit. This crystal oscillator circuit, generally referenced by the numeral 100, may comprise a current source 102, a first resistor 104, a P-Channel metal oxide semiconductor (PMOS) field effect transistor (FET) 106, a first capacitor 108, a second resistor 110, a crystal frequency determining element 112, a second capacitor 114, a third capacitor 116, and an NMOS FET 118 configured in a totem pole circuit configuration with the PMOS FET 106. The crystal oscillator circuit 100 depends on circuit noise energy to start up its oscillation, and takes the longest time to come up to full operational oscillation output. A crystal oscillator circuit 100 oscillating at 32 KHz may take up to three to four seconds to start-up, and a 32 MHz oscillator may take about 5 to 20 milliseconds for start-up.

This is a standard crystal oscillator circuit design, and one having ordinary skill in electronic circuit design and the benefit of this disclosure could easily come up with other crystal oscillator circuit designs that work equally well. All of these other crystal oscillator circuits are applicable to this disclosure and are contemplated herein.

Referring to FIG. 2, depicted is a schematic diagram of an inverter implementation of the oscillator shown in FIG. 1. The main oscillating active device shown in the oscillator 100a is an inverter 222 followed by another inverter 224 used as a buffer amplifier having an output 226.

Referring to FIG. 3, depicted is a schematic diagram of a trans-conductor implementation of the oscillator shown in FIG. 1. The main oscillating active device shown in the oscillator 100b is a trans-conductor 322 followed by an inverter 324 used as a buffer amplifier having an output 326.

A challenge for an ultra-low power oscillator as shown in FIGS. 2 and 3 is that a wide variation in crystal quality based on temperature-range exists. The $R_{ESR}$ range of a typical crystal may be from about 30 kilohms to about 90 kilohms.

Referring to FIG. 4, depicted is a schematic block diagram of an ultra-low power crystal oscillator with adaptive self-start, according to a specific example embodiment of this disclosure. An ultra-low power crystal oscillator with adaptive self-start, generally represented by the numeral 400, may comprise a high and low power controllable Gm device 424, an inverter 426, controllable switches 442 and 428 coupled between a supply voltage, $V_{dd}$, (Vbias+) and a supply common, $V_{ss}$, (Vbias−), respectively, and an output of the Gm device 424; a positive half-cycle edge delay circuit 430, a first pulse generator 432 activated on a positive going clock edge, an inverter 434, a counter controller 436, a second pulse generator 438 activated on a negative going clock edge, a negative half-cycle edge delay circuit 440, a high/low current control 444 for the Gm device 424, and controllable switches 448 and 446 coupled between the supply voltage, $V_{dd}$, (Vbias+) and the supply common, $V_{ss}$, (Vbias−), respectively. The first and second pulse generators 432 and 438 may be a single pulse generator having configurable pulse outputs for controlling positive pulses, negative pulses, or both positive and negative pulses.

The Gm device 424, running in a high power mode, may be used to support crystals having a wide range of $R_{ESR}$, e.g., from about 30 kilohms to about 90 kilohms. Power consumption for the Gm device 424 running in a high power mode may be, for example but is not limited to, approximately 500 nanoamperes (typical) and about one (1) microampere (maximum) which is too high for deep-sleep sticker devices. So by starting crystal oscillation when in a high power mode and staying in this high power mode for a certain number of oscillation cycle counts, e.g., 4096/8192, will ensure start-up oscillation. Once the oscillation is sustained, start producing energy pulses to the oscillator circuit, e.g., 100 nanosecond wide pulses synchronized with the crystal oscillator output frequency. Then switch to a low power mode where the Gm device 424 uses lower current, e.g., about ten (10) percent of the current used when in the high power mode.

This may be accomplished with a high/low current control 444 for controlling the Gm device 424 in either a high or low power mode, wherein the current control 444 is further controlled by a counter/controller 436 which counts the number of cycles generated by the oscillator output (output of inverter 426). Wherein the counter/controller 436 ensures that the crystal oscillator runs in the high power mode long enough to ensure adequate start-up oscillation. Then once enough time has passed to ensure adequate start-up oscillation, the counter/controller 436 instructs the high/low current control 444 to switch the Gm device 424 to the low power mode, and enables either or both pulse generators 432 and 438.

The pulse generators 432 and 438 may generate pulses that are synchronized with the frequency of the oscillator output (output of inverter 434) so that maximum may be transferred to the oscillator circuit within the crystal frequency bandwidth. The pulse widths may also be from about five (5) nanoseconds to about 500 nanoseconds. The energy pulses to the crystal oscillator, as generated by the pulse generators 432 and/or 438, may be provided by using any one of the following three options:

(1) Positive pulses generated by closing switch 442 which applies Vbias+ pulses to the Gm device 424 on a rising edge of the oscillator output from the inverter 434, and optionally followed by a half cycle delay 430 to closing switch 428 to Vbias−.

(2) Negative pulses generated by closing switch 448 which applies Vbias+ pulses to the Gm device 424 on a falling edge of the oscillator output from the inverter 434, and optionally followed by a half cycle delay 440 to closing switch 446 to Vbias−.

(3) Both positive and negative pulses at the rising and falling clock edges to Vbias+ and Vbias−, respectively, as provided by switches 428, 430, 446 and 448.

Referring to FIG. 5, depicted are schematic graphs of oscillator input and output waveforms, according to the teachings of this disclosure. Positive pulses from switch 448 are shown on the rising clock oscillator waveform, and negative pulses from switch 446 are shown on the falling clock oscillator waveform.

Figure 6:
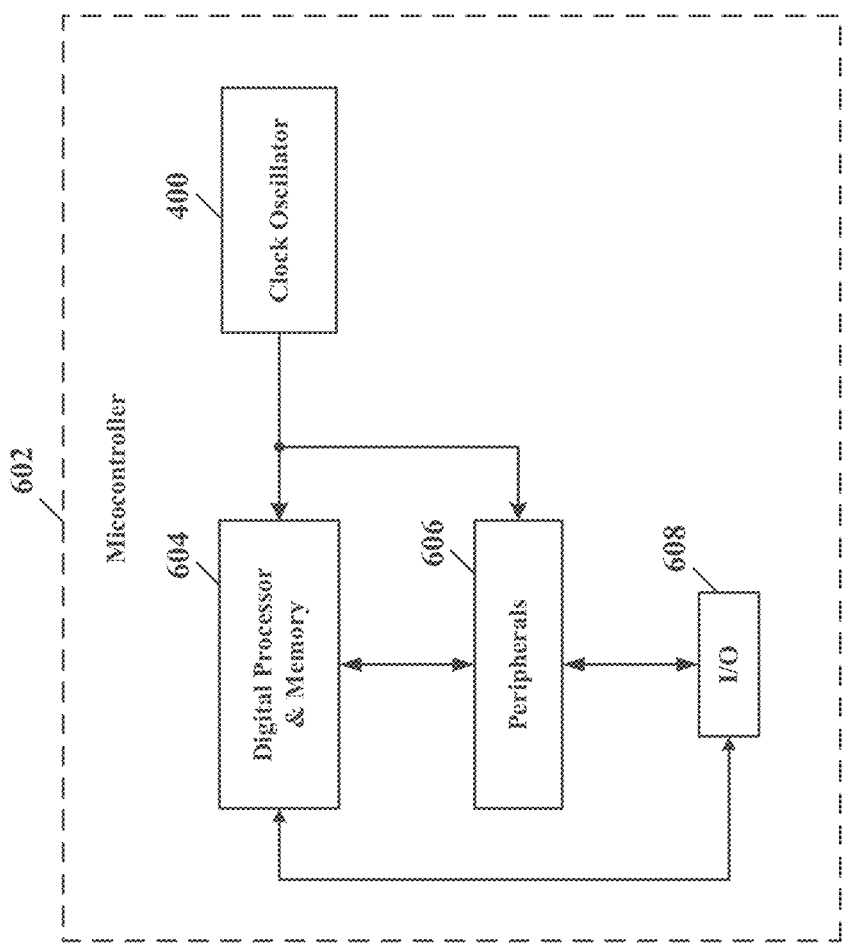
FIG. 6 illustrates a schematic block diagram of a microcontroller comprising the crystal oscillator circuit shown in FIG. 4, according to the teachings of this disclosure.

Referring to FIG. 6, depicted is a schematic block diagram of a microcontroller comprising the crystal oscillator circuit shown in FIG. 4, according to the teachings of this disclosure. A microcontroller 602 may comprise a digital processor and memory 604, peripheral modules 606, input/output 608 and a clock oscillator 400. The clock oscillator 400 may be coupled to the external crystal 112 and associated external components, e.g., resistors 110, 220 and 320; and capacitors 114 and 116. The digital processor and memory 604 (core) and peripherals 606 may be coupled to different clock signals, e.g., The digital processor 604 coupled to a faster clock oscillator 400, and the peripherals 606 coupled to a slower clock oscillator 610. The input/output 608 may be coupled to an even slower clock oscillator 612.

The crystal oscillator embodiment disclosed herein allows the microcontroller 602 to start operation sooner and thereafter run at lower power.

The invention claimed is:

1. An integrated oscillator configured to be coupled with an external crystal, comprising:
    an oscillator having first and second connections configured for connection with the external crystal to control an oscillation frequency thereof;
    a control circuit configured to operate in a first and a second mode, wherein at start-up of the oscillator the control circuit operates in the first mode and configures the oscillator to operate at a first power consumption, wherein the control circuit switches to the second mode after a certain time period of the oscillator oscillating; wherein when in the second mode the control circuit configures the oscillator to operate at a second power consumption which is less than the first power consumption; and
    a pulse generator unit configured to sustain oscillation during operation at the second power consumption by injecting pulses into the first and/or second connections of the oscillator at rising and/or falling edges of an output signal from the oscillator.

2. The integrated oscillator according to claim 1, further comprising a counter to determine the certain time period by counting a number of cycles of the output signal from the oscillator.

3. The integrated oscillator according to claim 2, wherein the pulse generator is enabled by the counter and generates at least one pulse every cycle of the output signal.

4. The integrated oscillator according to claim 3, wherein the pulse generator generates the pulses having pulse widths from about five (5) nanoseconds to about 500 nanoseconds.

5. The integrated oscillator according to claim 4, wherein the pulse generator generates the pulses having pulse widths of about 100 nanoseconds.

6. The integrated oscillator according to claim 4, wherein the pulse generator generates the pulses having pulse widths of about 5 nanoseconds.

7. The integrated oscillator according to claim 1, wherein the second power consumption is less than the first power consumption.

8. The integrated oscillator according to claim 7, wherein the second power consumption is about ten percent of the first power consumption.

9. A microcontroller comprising the integrated oscillator according to claim 1.

10. The integrated oscillator according to claim 1, wherein the oscillator comprises an inverter.

11. The integrated oscillator according to claim 1, wherein the oscillator comprises a trans-conductor.

12. The integrated oscillator according to claim 1, wherein the oscillator comprises:
    a current source coupled to a supply voltage;
    a first resistor coupled to a bias voltage;
    a first capacitor coupled to the first resistor;
    a second resistor coupled to the first capacitor;
    a first transistor coupled to the current source, first capacitor, and first and second resistors;
    a second capacitor coupled to the first capacitor and second resistor;
    a third capacitor coupled to the second resistor and first transistor;
    a second transistor coupled to the first, second and third capacitors, the second resistor and the first transistor; and
    the external crystal coupled to the first and second transistors; the first, second and third capacitors; and the second resistor.

13. The integrated oscillator according to claim 1, wherein the first power consumption comprises a current of from about 500 nanoamperes to about one (1) microampere.

14. The integrated oscillator according to claim 1, wherein the second power consumption comprises a current of from about 25 nanoamperes to about 100 nanoamperes.

15. The integrated oscillator according to claim 1, wherein the pulses are delayed by about one-half cycle from the rising and/or falling edges of the output signal from the oscillator.

16. A method for starting and running an integrated oscillator configured to be coupled with an external crystal, said method comprising the steps of:
- controlling a frequency of an oscillator with a crystal, wherein the crystal is coupled with the oscillator;
- starting operation of the oscillator in a first mode wherein the oscillator operates at a first power consumption;
- operating the oscillator in a second mode after a certain time period of the oscillator oscillating, wherein the oscillator operates at a second power consumption and the second power consumption is less than the first power consumption; and
- injecting pulses through a coupling between the crystal and the oscillator into the oscillator at rising and/or falling edges of an output signal from the oscillator to sustain operation of the oscillator at the second power consumption.

17. The method according to claim 16, further comprising the step of delaying the pulses by about one-half cycle from the rising and/or falling edges of the output signal from the oscillator.

18. An integrated oscillator configured to be coupled with an external crystal, comprising:
- an oscillator driving circuit configured to be coupled with first and second terminals of the external crystal to control an oscillation frequency thereof;
- a control circuit configured to operate in a first and a second mode, wherein at start-up of the oscillator the control circuit operates in the first mode and configures the oscillator to operate at a first power consumption, wherein the control circuit switches to the second mode after a certain time period of the oscillator oscillating;
- wherein when in the second mode the control circuit configures the oscillator to operate at a second power consumption which is less than the first power consumption; and
- a pulse generator unit configured to be coupled with the first and second terminals to sustain oscillation during operation at the second power consumption by injecting pulses into the oscillator driving circuit at rising and/or falling edges of an output signal from the oscillator.

* * * * *